United States Patent
Koo et al.

(12)

(10) Patent No.: US 6,556,049 B2
(45) Date of Patent: Apr. 29, 2003

(54) OUTPUT DRIVER HAVING OUTPUT CURRENT COMPENSATION AND METHOD OF COMPENSATING OUTPUT CURRENT

(75) Inventors: Yi-do Koo, Seoul (KR); Chang-sik Yoo, Suwon (KR); Kee-wook Jung, Seoul (KR); Won-chan Kim, Seoul (KR)

(73) Assignee: Samsung Electronics, Co., Ltd., Suwon (KR)

( * ) Notice: Subject to any disclaimer, the term of this patent is extended or adjusted under 35 U.S.C. 154(b) by 0 days.

(21) Appl. No.: 09/805,210

(22) Filed: Mar. 14, 2001

(65) Prior Publication Data

US 2002/0021143 A1 Feb. 21, 2002

(30) Foreign Application Priority Data

Aug. 21, 2000 (KR) ........................................ 2000-48325

(51) Int. Cl.[7] .......................................... H03K 19/0175
(52) U.S. Cl. .......................................... 326/87; 326/119
(58) Field of Search ............................. 326/82, 83, 86, 326/87, 112, 119; 327/538; 323/313, 315, 316

(56) References Cited

U.S. PATENT DOCUMENTS 5,023,488 A   6/1991  Gunning .................. 326/86
5,606,275 A * 2/1997  Farhang et al. ............ 327/108
6,144,218 A * 11/2000 Smith et al. .................. 326/32

FOREIGN PATENT DOCUMENTS

EP    0 718 744 A2    6/1996
JP    407074612 A  *  3/1995

* cited by examiner

Primary Examiner—Michael Tokar
Assistant Examiner—James H Cho

(57) ABSTRACT

An output driver supplying constant output current regardless of output voltage changes. The output driver includes a current source for regulating changes in a voltage of an output terminal responsive to a reference signal, and an output current compensator that responds to the current source to supply constant current to the terminal. The current source includes a first MOS transistor having a drain coupled to the terminal and a gate to which the reference signal is input, and a second MOS transistor having a drain coupled to a source of the first MOS transistor, a gate to which data is input, and a source coupled to ground. The current source may be an open drain current source. The output current compensator includes a current compensator coupled to the terminal, and a sensing driver for sensing voltage changes of the terminal and driving the current compensator.

12 Claims, 2 Drawing Sheets

OUTPUT DRIVER HAVING OUTPUT CURRENT COMPENSATION AND METHOD OF COMPENSATING OUTPUT CURRENT

The present application claims priority under 35 U.S.C. §119 to Korean Application No. 2000-48325 filed on Aug. 21, 2000, which is hereby incorporated by reference in its entirety for all purposes.

BACKGROUND OF THE INVENTION

1. Field of the Invention

The present invention relates to an output driver of a semiconductor memory device and a method of driving an output of a semiconductor device, and more particularly, to an output driver of an input/output (I/O) interface in a Rambus dynamic random access memory (RDRAM).

2. Description of the Related Art

The JC-16 Subcommittee under Joint Electronic Device Engineering Council (JEDEC) has approved a gunning transceiver logic (GTL) as a standard for an interface suitable for a synchronous DRAM (SDRAM). In a RDRAM having a bandwidth more than 1.6 gigabytes per second, a Rambus signaling logic (RSL) is used as an interface. In high-speed data transmission, to reduce emission of electromagnetic interference (EMI), a swing of an output voltage needs to be reduced as much as possible.

FIG. 1 is a block diagram of a memory interface of a conventional RDRAM. Referring to FIG. 1, an I/O interface includes a control master 10, RDRAMs 11, 13, 15, and 17, transmission lines 1, 3, 5, 7, and 9, an end resistor Rterm, and a terminal voltage Vterm. Each RDRAM 11, 13, 15, or 17 includes an output driver 19, a receiver 18, and an input/output terminal 16 for the receiver 18 and the output driver 19.

FIG. 2 is a schematic diagram of the open drain output driver of FIG. 1 including a current source. Referring to FIG. 2, the conventional open drain output driver 19 includes one or more current sources connected in parallel to the output terminal 16. In this case, for convenience of explanation, only the last current source will be described. The output driver 19 controls a swing of an output voltage of the output terminal 16 using the NMOS current source consisting of NMOS transistors M1 and M2. The operation of the output driver 19 in the I/O interface, in which the plurality of RDRAMs 11, 13, 15, and 17 are coupled to the transmission lines 1, 3, 5, 7, and 9, will now be described with reference to FIGS. 1 and 2. If the NMOS transistor M2 operates in a saturation region by a predetermined reference signal Vg, then current flowing through the NMOS transistor M2 as a current source maintains a constant value. Thus, a voltage Vout of the output terminal 16 has a swing by data DAT1 input to the gate of the NMOS transistor M1.

The output driver 19 drives data having a value "1" or data having a value "0" to the single-terminated transmission lines 1, 3, 5, 7, and 9, according to the data DAT1. If the output driver 19 drives the transmission lines 1, 3, 5, 7, and 9, the output voltage Vout of the output terminal 16 may be reduced compared to a normal output voltage level by overlapping previous data and current data due to propagation delay on the transmission lines. If the output voltage Vout of the output terminal 16 is reduced and the NMOS transistor M2 operates in a linear region instead of a saturation region, current flowing through the NMOS transistor M2 from the output terminal 16 is reduced.

Consequently, if the output voltage Vout of the output driver 19 decreases, the current flowing at the output terminal 16 becomes smaller. Thus, overlapping of voltages at the transmission lines 1, 3, 5, 7, and 9 of the memory interface may hamper correct data sampling.

SUMMARY OF THE INVENTION

The present invention is therefore directed to an output driver, and a method of driving an output, which substantially overcomes one or more of the problems due to the limitations and disadvantages of the related art.

To solve the above problems, it is an objective of the present invention to provide an output driver, and a method of driving an output, for supplying constant output current independently of changes in an output voltage.

Accordingly, to achieve the above objectives, the present invention provides an output driver including a current source for regulating changes in a voltage of an output terminal in response to a reference signal, and an output current compensating circuit which responds to the current source in order to supply constant current to the output terminal.

The current source includes a first metal-oxide-semiconductor (MOS) transistor having a drain coupled to the output terminal and a gate to which the reference signal is input, and a second MOS transistor having a drain coupled to a source of the first MOS transistor, a gate to which data is input, and a source coupled to a ground voltage. For example, the current source may be an open drain current source. The output current compensating circuit includes a current compensating unit coupled to the output terminal, and a sensing driving unit for sensing voltage changes of the output terminal and driving the current compensating unit.

The above objectives may also be achieved by providing a method of driving an output including providing a current to an output terminal responsive to a reference signal, so that a voltage is realized at the output terminal; monitoring the voltage at the output terminal to provide a control signal; and maintaining the current provided to the output terminal constant responsive to the control signal.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

Figure 1:
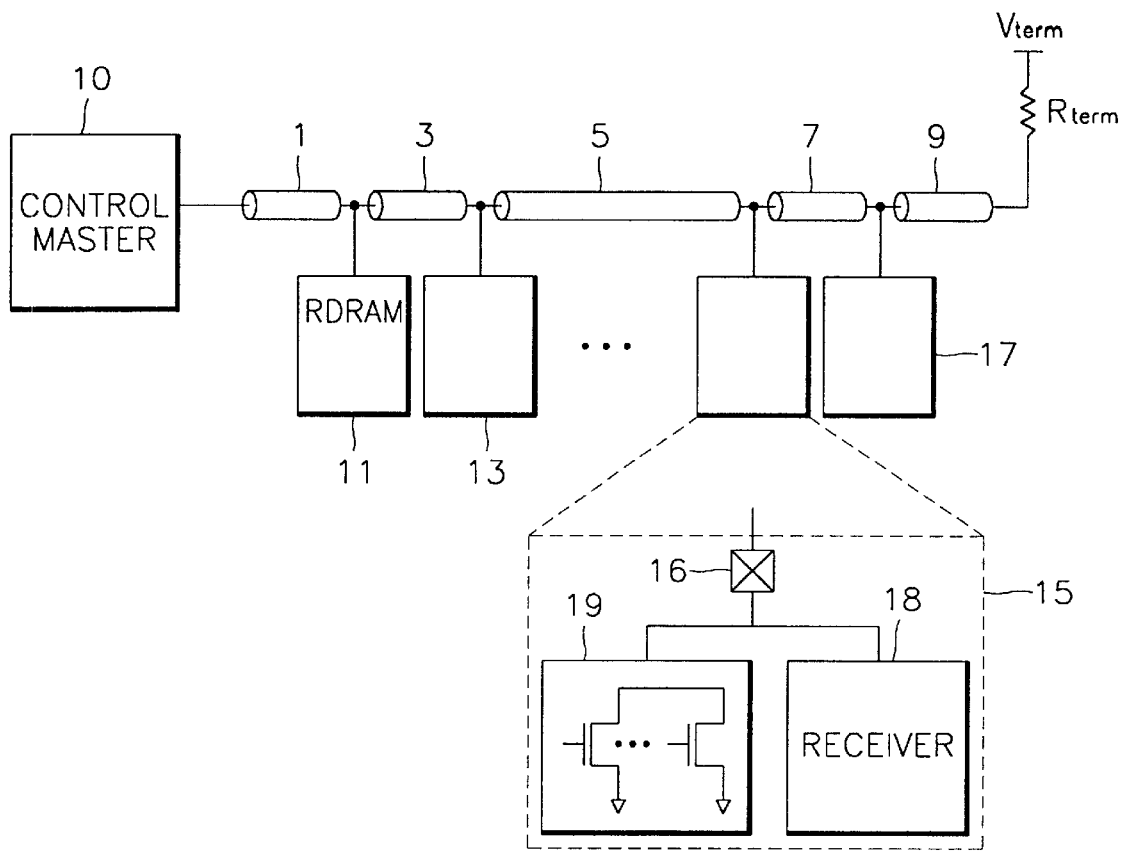
FIG. 1 is a block diagram of a memory interface of a conventional Rambus dynamic random access memory (RDRAM)
Figure 2:
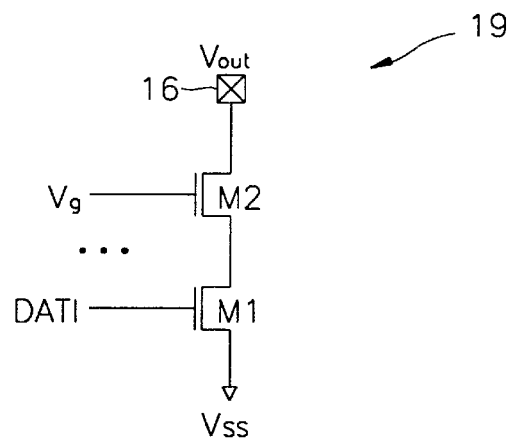
FIG. 2 is a schematic diagram of the output driver of FIG. 1 including an open drain current source.

The present invention will now be described more fully with reference to the accompanying drawings, in which preferred embodiments of the invention are shown. The same reference numerals appearing in different drawings represent the same element.

Figure 3:
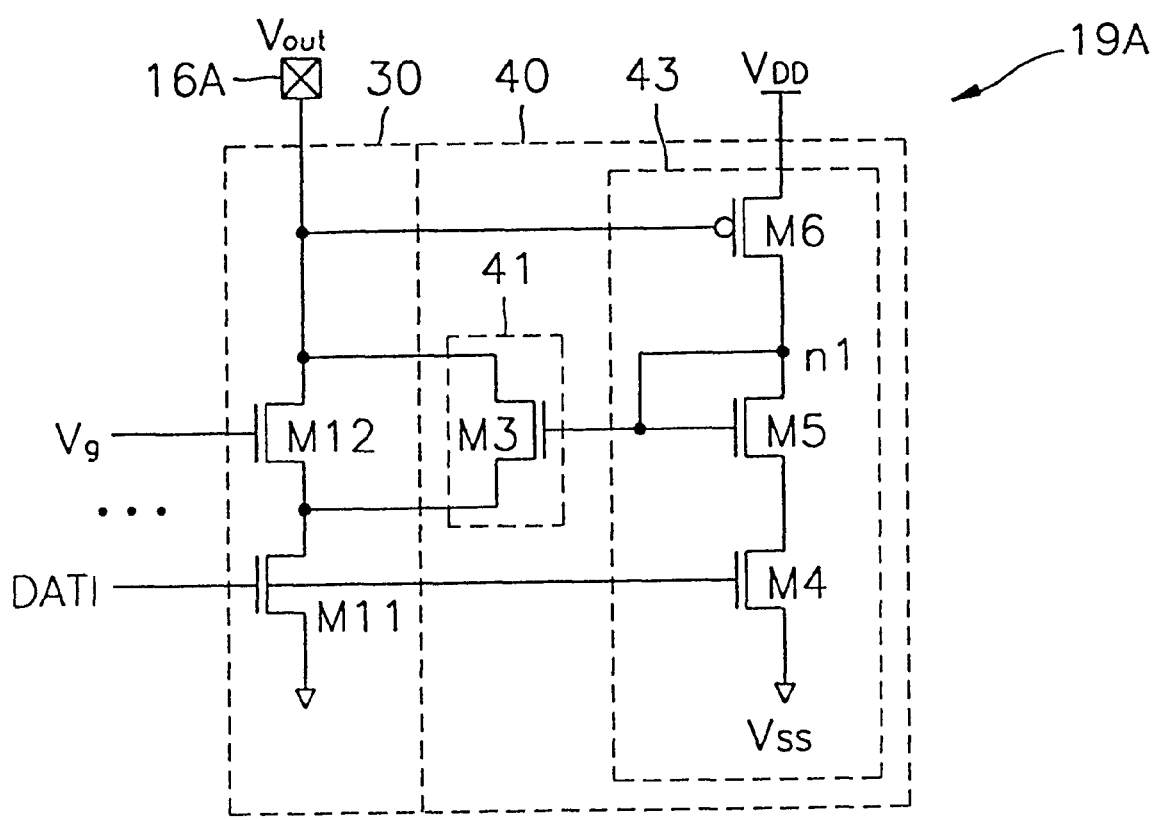
FIG. 3 is a schematic diagram of an output driver including a current source according to an embodiment of the invention.

Referring to FIG. 3, an output terminal 16A of an output driver 19A is coupled in parallel to one or more open drain current sources 30, so that the amount of output current may be controlled. However, in this case, only the configuration of the current source 30 will be described for convenience of explanation.

As shown in FIG. 3, the output driver 19A includes the current source 30, the output terminal 16A, and an output current compensation circuit 40. The output current compensation circuit 40 includes a current compensating unit 41 and a sensing driving unit 43. The current source 30 consists of an NMOS transistor M12 having a drain coupled to the output terminal 16A and a gate to which a reference voltage Vg is applied, and an NMOS transistor M11 having a drain coupled to a source of the NMOS transistor M12, a gate to which DAT1 is input, and a source coupled to a ground voltage Vss. The current source 30 is an open drain current source.

The current compensating unit 41 includes an NMOS transistor M3 having a drain coupled to the output terminal 16A and a source coupled to the source of the NMOS transistor M12. The sensing driving unit 43 includes a PMOS transistor M6 having a gate coupled to the output terminal 16A and a source coupled to a supply voltage VDD. The sensing driving unit 43 also includes an NMOS transistor M5 having a gate and a drain coupled to the gate of the NMOS transistor M3, wherein the drain of the NMOS transistor M5 is also coupled to the drain of the PMOS transistor M6. A source of the NMOS transistor M5 is coupled to the ground voltage Vss through an NMOS transistor M4. The NMOS transistor M4 is provided to improve performance of the sensing driving unit 43, and includes a drain coupled to the source of the NMOS transistor M5, a gate to which data DAT1 is input and a source coupled the ground voltage Vss.

The operation of the output driver 19A according to the invention will now be described with reference to FIG. 3. An output voltage Vout available from a RDRAM lies in the range of about 1.0–1.8 V, and a reference voltage Vg is about 1.6 V. When the NMOS transistor M12 operates in a saturation region by the reference voltage Vg, then constant current flows through the NMOS transistor M12 acting as a current source. In this case, if the NMOS transistor M11 to which data DAT1 is input is turned on, then current flows from the output terminal 16A to the ground voltage Vss, i.e., the current source 30 is in the state of consuming current, thereby outputting data having value "0" to the output terminal 16A. On the other hand, if the NMOS transistor M11 is turned off, current doesn't flow from the output terminal 16A to the ground voltage Vss, i.e., the current source 30 is in the state of non-consuming current, thereby outputting data having value "1" to the output terminal 16A. Here, if the output driver 19A does not operate, the output voltage Vout is 1.8 V. If the output driver 19A drives the transmission lines 1, 3, 5, 7, and 9 of FIG. 1 having predetermined impedance, the output voltage Vout decreases.

If the output voltage Vout is reduced to about 0.6 V due to propagation delay of the transmission lines 1, 3, 5, 7, and 9, the NMOS transistor M12 operates in a linear region. Thus, current flowing through the NMOS transistor M12 is reduced. In this case, if the output voltage Vout is reduced to such an extent that the PMOS transistor M6 is turned on, current flows through a node n1 by the supply voltage $V_{DD}$.

If data DAT1 input to the NMOS transistor M11 has a value "1", the NMOS transistors M11 and M4 are turned on, and current flowing through the node n1 is mirrored to the NMOS transistor M3 through the NMOS transistor M5. Thus, even if the output voltage Vout decreases to reduce current flowing through the NMOS transistor M12, turning on the NMOS transistor M3 makes the entire current flowing into the output terminal 16A through the NMOS transistors M12 and M3 constant.

Furthermore, the same data DAT1 is input to the NMOS transistors M4 and M11 and the width-to-length (W/L) ratios of the NMOS transistors M3 and M5 are controlled so that the entire current can have a constant value. For example, the width-to-length (W/L) ratios of the NMOS transistors M3 and M5 are controlled so that current of about 14.5 mA flows in each of the NMOS transistors M11 and M12 and current of 0.3 mA flows in the NMOS transistor M3 when the output voltage Vout is 1.0 V.

Furthermore, current flowing into the NMOS transistor M3 may change depending on an output voltage Vout. For the control master 10 to sample a correct voltage value, the output voltage Vout needs to be stabilized within at least half a cycle.

Stabilization in the output driver 19A having a current-feedback structure according to an embodiment of the invention is determined by how fast the node n1 is charged. For example, if current flowing in the PMOS transistor M6 maintains about 300 μA when the output voltage Vout is 1.0, quick stabilization may be obtained without additional large current consumption. The output driver 19A according to an embodiment of the invention allows for correct sampling at the input terminal 16 of the receiver 18 (See FIG. 1) by driving constant current to the output terminal 16A regardless of changes in the output voltage Vout.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An output driver comprising:
a current source that regulates changes in a voltage of an output terminal in response to a reference signal; and
an output current compensating circuit, responsive to the voltage at the output terminal, that controls the current source to supply constant current to the output terminal,
wherein the current source comprises:
a first metal-oxide-semiconductor (MOS) transistor having a drain coupled to the output terminal and a gate to which the reference signal is input; and
a second MOS transistor having a drain coupled to a source of the first MOS transistor, a gate to which data is input, and a source coupled to a ground voltage.

2. The output driver of claim 1, wherein the output current compensating circuit comprises:
a current compensating unit coupled to the output terminal; and
a sensing driving unit that senses voltage changes at the output terminal and drives the current compensating unit.

3. The output driver of claim 2, wherein the current compensating unit comprises a third MOS transistor having a drain coupled to the output terminal and a source coupled to the source of the first MOS transistor.

4. The output driver of claim 3, wherein the sensing driving unit comprises:
   a fourth MOS transistor having a gate coupled to the output terminal and a source coupled to a first voltage; and
   a fifth MOS transistor having a drain coupled to a drain of the fourth MOS transistor and a gate of the third MOS transistor, a gate coupled to the gate of the third MOS transistor, and a source coupled to the ground voltage.

5. The output driver of claim 4, wherein the sensing driving unit further comprises a sixth MOS transistor having a drain coupled to the source of the fifth MOS transistor, a source coupled to the ground voltage, and a gate to which the data is input.

6. An output driver comprising:
   a current source that provides a current to an output terminal responsive to a reference signal, so that a voltage is realized at the output terminal;
   a sensing driver, coupled to the output terminal, that monitors the voltage at the output terminal to provide a control signal; and
   a current compensator, coupled to said current source, that maintains the current provided by said current source to the output terminal constant, responsive to the a control signal.

7. The output driver of claim 6 wherein said current source comprises:
   a first metal-oxide-semiconductor (MOS) transistor having a drain coupled to the output terminal and a gate to which the reference signal is input; and
   a second MOS transistor having a drain coupled to a source of said first MOS transistor, a gate to which data is input, and a source coupled to a ground voltage.

8. The output driver of claim 7, wherein said current compensator comprises a third MOS transistor having a drain coupled to the output terminal, a source coupled to the source of said first MOS transistor and a gate coupled to the control signal.

9. The output driver of claim 8, wherein said sensing driver comprises:
   a fourth MOS transistor having a gate coupled to the output terminal and a source coupled to a first voltage; and
   a fifth MOS transistor having a drain coupled to a drain of said fourth MOS transistor and the gate of said third MOS transistor, a gate coupled to the gate of said third MOS transistor, and a source coupled to the ground voltage.

10. The output driver of claim 9, wherein said sensing driver further comprises a sixth MOS transistor having a drain coupled to the source of said fifth MOS transistor, a source coupled to the ground voltage, and a gate to which the data is input.

11. The output driver of claim 6, wherein said current source is an open drain current source.

12. The output driver of claim 6, wherein said current compensator is operated by the control signal so that the current flowing into the output terminal through said current source and said current compensator is maintained constant.

* * * * *